United States Patent [19]

Saitoh et al.

[11] Patent Number: 5,234,901
[45] Date of Patent: Aug. 10, 1993

[54] PROCESS FOR DEPOSITING A DIFFERENT THIN FILM ON AN OXIDE SUPERCONDUCTOR

[75] Inventors: Mitsuchika Saitoh; Michitomo Iiyama, both of Osaka, Japan

[73] Assignee: Sumitomo Electric Industries, Ltd., Osaka, Japan

[21] Appl. No.: 728,212

[22] Filed: Jul. 12, 1991

[30] Foreign Application Priority Data

Jul. 12, 1990 [JP] Japan ................................. 2-184867

[51] Int. Cl.$^5$ ........................... B05D 3/06; B05D 5/12
[52] U.S. Cl. ......................................... 505/1; 505/731; 505/732; 505/730; 427/62; 427/596; 427/419.1; 204/192.24
[58] Field of Search ................... 505/1, 731, 732, 730; 427/62, 63, 53.1, 419.1, 126.3, 309, 596; 204/192.24

[56] References Cited

FOREIGN PATENT DOCUMENTS 0392437 10/1990 European Pat. Off. .
63-283086 11/1988 Japan .
2-87688 3/1990 Japan .

OTHER PUBLICATIONS

Aizaki et al, "YBa$_2$Cu$_3$O$_y$ superconducting thin film obtained by laser annealing", Jpn. J. Appl. Phys. 27(2) Feb. 1988 L231–L233.

Singh et al, "Excellent thermal stability of superconducting properties in YBa$_2$Cu$_3$O$_7$ films irradiated by pulsed excimer lasers", Appl. Phys. lett. 59(11), Sep. 1991 pp. 1380–1382.

*Workshop on High Temperature Superconducting Electron Devices*, Moore et al, "Superconducting Thin Films for Device Applications," pp. 281–284 (Jun. 7, 1989).

*Extended Abstracts of the 20th Conference on Solid State Devices and Materials*, Yonezawa et al, "Preparation of High Tc Oxide Superconducting Films by Laser Annealing," pp. 435–438 (Aug. 1988).

*Japanese Journal of Applied Physics*, vol. 28, No. 11, Otsubo et al, "Crystallization induced by laser irradiation in Ba-Y-Cu-O superconducting films prepared by laser ablation," pp. 2211–2218 (Nov. 1989).

*Materials Letters*, vol. 8, No. 5, Perrin et al, "Annealing effects on the 110 K transition in the Bi$_1$Sr$_1$Ca$_1$Cu$_2$ oxide superconductor," pp. 165–170 (Jun. 1989).

Primary Examiner—Michael Lusigan
Assistant Examiner—Roy V. King
Attorney, Agent, or Firm—Kerkam, Stowell, Kondracki & Clarke

[57] ABSTRACT

Improvement in a process for depositing a thin film on an oxide superconductor thin film deposited previously on a substrate.

A surface of the thin film of oxide superconductor is irradiated with laser beam pulses in high-vacuum of lower than $1 \times 10^{-6}$ Torr before said another thin film is deposited thereon.

The invention is applicable to fabrication of electronics devices such as Josephson element or superconducting transistors.

15 Claims, No Drawings

PROCESS FOR DEPOSITING A DIFFERENT THIN FILM ON AN OXIDE SUPERCONDUCTOR

BACKGROUND OF THE INVENTION

1. Field of the Invention

The present invention relates to a process for depositing a thin film on a thin film of oxide superconductor, more particularly, to a process for improving crystallinity of a surface of the thin film of oxide superconductor so that another thin film grows epitaxially on the surface of oxide superconductor.

2. Description of the Related Art

A superconducting compound oxide of $(La,Sr)_2CuO_4$ which exhibits the superconductivity at 30 K. was discovered in 1986 by Bednorz and Müller (Z. Phys. B64, 1986 p 189). Then, another superconducting material of $YBa_2Cu_3O_{7-\delta}$ having the critical temperature of about 90 K. was discovered in 1987 by C. W. Chu et al. (Physical Review letters, Vol. 58, No. 9, p 908) and Maeda et al discovered so-called bismuth type superconducting material of Bi—Sr—Ca—Cu—O (Japanese Journal of Applied Physics, Vol. 27, No. 2, p 1209 to 1210). The other high-temperature compound oxide systems are also reported.

These superconducting compound oxides are expected to be utilized in electronics devices such as Josephson element or superconducting transistors due to their high critical temperatures (Tc). In order to realize such electronics devices, it is indispensable to deposit a plurality of thin films of superconducting oxide on a substrate successively. For example, in the case of so-called tunnel type Josephson Junction having a layered structure of superconductor/non-superconductor/superconductor, at least three layers of a thin film of the first superconductor, a thin film of the non-superconducting and a thin film of the second superconductor must be deposited successively on a substrate.

In the tunnel type Josephson Junction, a thickness of the non-superconductor layer is determined by or depends on the coherent length of superconductor used. However, in the case of the thin film layer of oxide superconductor, the thickness of the non-superconductor layer must be as thin as several nanometers (nm) because the coherent length of oxide superconducting is very short, so that it is requested to prepare a very thin film of non-superconductor.

Still more, in order to realize a Josephson Junction of high performance, such very thin film of non-superconductor must have good crystallinity of high quality. In fact, from the view point of performance of electronics devices, it is preferable that all thin film layers of superconductor/non-superconductor/superconductor have good crystallinity of high quality and are preferably made of single crystals. In other words, if one of the thin film layers is of polycrystal or amorphous, the resulting Josephson Junction including such polycrystal or amorphous thin film layer(s) shows poor performance and, in the worst case, does not work.

The thin films having good crystallinity of high quality are also required in a process for fabricating the superconducting transistors in which superconductor is combined with semiconductor.

However, it has been difficult to prepare a layered structure of superconductor/non-superconductor/superconductor in which all layers possess high crystallinity without spoiling the superconducting property in the superconductor layers by known process because of the following reason:

When a first thin film of oxide superconductor deposited is exposed to air, both of superconductivity and crystallinity are deteriorated or lost to a depth of about 1 nm at a surface of the first thin film. In the prior arts, the deposited first thin film of oxide superconductor is inevitably exposed to air, because deposition of the first thin film of oxide superconductor (for example, prepared by sputtering) and deposition of another thin film to be layered thereon (for example, prepared by vacuum evaporation) are carried out in different chambers, so that the first thin film of oxide superconductor is necessarily exposed to air during transportation from one chamber to another chamber.

In order to solve this problem, in the prior arts, the first thin film of oxide superconductor is heat-treated at about 700° C. in ultra-high vacuum of about $1 \times 10^{-9}$ Torr before another thin film is deposited thereon. It is true that this heat-treatment improves crystallinity of the surface of the first thin film of oxide superconductor and hence the upper thin film to be deposited thereon can be grown epitaxially.

However, such heat-treatment carried out in such ultra-high vacuum has such a drawback that oxygen atom which is a constituent element of the first thin film layer of oxide superconductor is lost, resulting in that the superconducting property of the first thin film is deteriorated and, in the worst case, disappears.

The superconducting property may be maintained if the heat-treatment is carried out in oxygen atmosphere. In this case, however, crystallinity of the surface of the first thin film of oxide superconductor can not be improved or becomes worse.

Therefore, an object of the present invention is to solve the problems and to provide a process to improve crystallinity of the surface of the first thin film of oxide superconductor on which another thin film is to be deposited without spoiling superconducting property of the first thin film.

SUMMARY OF THE INVENTION

The present invention provides a process for depositing another thin film on a first thin film of oxide superconductor deposited previously on a substrate, a characterized in that a surface of the first thin film of oxide superconductor is irradiated with laser beam pulses in high-vacuum of lower than $1 \times 10^{-6}$ Torr, preferably lower than $1 \times 10^{-8}$ Torr, before another thin film is deposited thereon.

According to the invention, the heat-treatment should be effected in vacuum of lower than $1 \times 10^{-6}$ Torr. If the vacuum is not lower than $1 \times 10^{-6}$ Torr, improvement in crystallinity of the thin film of oxide superconductor can not be obtained.

Laser beam pulses used in the present invention are preferably high-power laser beam pulses, each pulse having a very short unit emission time such as excimer laser pulses. According to the present invention a surface of the thin film of oxide superconductor irradiated with the laser pulses is heated instantaneously and then is cooled within a very short time duration. The term "heated" means that the thin film is irradiated with energy of any form.

In the process according to the present invention, crystallinity of the surface of the first thin film of oxide superconductor is improved in the same manner as prior art but, contrary to the prior art, oxygen inside the first thin film of oxide superconductor does not diffuse and is not lost because heating is effected instantaneously within a very short time. From this fact, the first thin film of oxide superconductor thus treated maintains good superconducting property and also possesses improved crystallinity. Therefore, another thin film such as non-superconductor which will be deposited on the first thin film of oxide superconductor thus treated can be grown epitaxially.

Laser beam pulses used in the present invention have preferably the energy density per one pulse of 0.01 to 0.1 J/cm$^2$. The energy density per one pulse which is not higher than 0.01 J/cm$^2$ is too low to improve the crystallinity of the thin film of oxide superconductor. To the contrary, if the energy density per one pulse exceeds 0.1 J/cm$^2$, the thin film of oxide superconductor will be damaged.

The number of laser pulses which are directed onto the thin film of oxide superconductor is determined in the function of various factors including the energy density, incident angle and surface condition of the thin film to be treated. When the energy density per one pulse is within the above-mentioned range, the number of laser pulses directed onto one spot on the thin film of oxide superconductor is selected preferably between 100 pulses and 1 pulse. In practice, irradiation of laser pulses is preferably adjusted by monitoring an irradiated area of the thin film of oxide superconductor by a reflective high energy electron diffraction (RHEED) analyzer, low density electron diffraction (LEED) analyzer or the like. When a plurality of laser pulses are directed onto one spot on the thin film of oxide superconductor, irradiation should not be repeated continuously in a short interval in order not to elevate temperature of an irradiated spot of the thin film to such a high value that oxygen escapes out of crystal.

The first and second thin films of oxide superconductors used in the process according to the present invention can be any known oxide superconductor including Y—Ba—Cu—O system such as $Y_1Ba_2Cu_3O_{7-x}$ (x is ±1), Bi—Sr—Ca—Cu—O system such as $Bi_2Sr_2Ca_2Cu_3O_x$ (x is about 10) and Tl—Ba—Ca—Cu—O system such as $Tl_2Ba_2Ca_2Cu_3O_x$ (x is about 10). Among them, $Y_1Ba_2Cu_3O_{7-x}$ is preferable because thin films of high quality are obtainable stably and $Tl_2Ba_2Ca_2Cu_3O_x$ is also preferable due to its high critical temperature (Tc). The first and second thin films of oxide superconductors and the non-superconductor layer can be prepared by sputtering technique. Operational condition of sputtering itself is known.

The thickness of the first thin film of oxide superconductor is not limited specially but has preferably a thickness of 20 to 3,000 Å, more preferably between 100 to 2,000 Å. If the thickness is not thicker than 20 Å, it is difficult to prepare a uniform thin film layer. Thicker thin film over 3,000 Å may not improve substantially the properties of the first thin film of oxide superconductor and will be a cause of inter-diffusion between substrate material and oxide superconductor.

The above-mentioned another thin film can be made of any non-superconducting material and has preferably a crystal structure and/or lattice constants which are similar to that of oxide superconductor of which the first and second thin films are made. For example, the non-superconductor can be made of $BaF_2$ and oxides such as MgO, $SrTiO_3$ or the like.

The thickness of the non-superconductor depends on the coherent length of oxide superconductor used and is in the order of several nanometers (nm).

In the case of a Josephson Junction, a second thin film of oxide superconductor is deposited further on the thin film of non-superconductor. The second thin film of oxide superconductor can be prepared by the same manner as the first thin film of oxide superconductor. The second thin film of oxide superconductor can be grown epitaxially on the thin film of non-superconductor prepared by the present invention because the later thin film possesses good crystallinity.

According to the process of the present invention, a well-crystalline thin film of non-superconductor can be prepared on a thin film of oxide superconductor and hence the tunnel type Josephson Junction can be realized from high-temperature oxide superconductors.

DESCRIPTION OF THE PREFERRED EMBODIMENTS

Now, the present invention will be described with reference to examples, but the scope of the present invention should not be limited thereto.

EXAMPLE 1

A Josephson Junction was produced on a substrate of MgO by depositing a first thin film of oxide superconductor, a thin film of $BaF_2$ as a non-superconductor and a second thin film of the same oxide superconductor as the first thin film successively in this order.

A first, the first thin film of oxide superconductor of $Y_1Ba_2Cu_3O_{7-x}$ (x is about ±1) which has a similar crystal structure to a c-axis oriented single crystal was deposited on a (100) plane of a MgO single crystal having a dimension of 8 mm × 10 mm by sputtering.

Operational conditions used for preparing the first thin film of oxide superconductor are as following:

| | |
|---|---|
| Composition of a target: | Y:Ba:Cu = 1:2:3 (atomic ratio): |
| Substrate temperature: | 700° C. for c-axis oriented film |
| Sputtering gas: | Ar: 90% |
| | O$_2$: 10% |
| Gas pressure: | 3 × 10$^{-2}$ Torr |
| Thickness of 1st layer: | 300 nm |

The resulting substrate having the first thin film of oxide superconductor was transferred from a sputtering chamber to a vacuum evaporation chamber and then a surface of the first thin film of oxide superconductor was irradiated with laser pulses under the following conditions:

| | |
|---|---|
| Gas pressure in chamber: | 1 × 10$^{-9}$ Torr |
| Laser used: | KrF excimer laser |
| wave length: | 248 nm |
| energy density: | 0.02 L/cm$^2$ |
| | (on a surface of the thin film) |
| numbers of pulses: | 3 to 5 pulses per one spot |

In this surface-treatment, the laser beam was scanned so that laser beam pulses were directed onto different spots on a surface of the first thin film of oxide superconductor. The number of laser pulses was determined by monitoring the surface by LEED such a manner that the first thin film of oxide superconductor shows good crystallinity.

Then, after the substrate temperature was elevated to 200° C., a non-superconducting intermediate thin film of $BaF_2$ was deposited on the first thin film of oxide superconductor by vacuum evaporation method. Operational conditions used for preparing the thin film of $BaF_2$ are as following:

| Substrate temperature: | 200° C. |
|---|---|
| Gas pressure (vacuum): | $1 \times 10^{-9}$ Torr |
| Thickness of $BaF_2$: | 5 nm |

It was confirmed by LEED that the thin film of $BaF_2$ was made of nearly a single crystal of good quality.

In order to determine the critical temperature (Tc) of the first thin film of oxide superconductor, the thin film was removed partly and electrodes were soldered with silver paste. The critical temperature (Tc) of the first thin film of oxide superconductor determined by usual four probe method was 85 K.

EXAMPLE 2

Example 1 was repeated except that the thickness of the first thin film of oxide superconductor was changed from 300 nm to 200 nm, the thickness of the non-superconductor thin film of $BaF_2$ was changed from 5 nm to 3 nm and that following operation was continued.

After the thin film of $BaF_2$ was deposited, a second thin film of oxide superconductor of $Y_1Ba_2Cu_3O_{7-x}$ was deposited on the resulting $BaF_2$ thin film by excimer laser deposition method in the same chamber. Operational conditions used for preparing the second thin film are as following:

| Substrate temperature: | 700° C. |
|---|---|
| Gas pressure (vacuum): | $3 \times 10^{-9}$ Torr |
| Thickness of $BaF_2$: | 200 nm |

The critical temperature (Tc) of the second thin film of oxide superconductor determined by the same method as Example 1 was 80 K.

We claim:

1. A process for depositing another film on a first film of oxide superconductor deposited previously on a substrate, characterized in that a surface of said first film of oxide superconductor is irradiated with laser beam pulses of such intensity and for a time sufficient to improve the crystallinity at said surface of said first film of oxide superconductor in high-vacuum of lower than $1 \times 10^{-6}$ Torr before said another film is deposited thereon.

2. The process set forth in claim 1 wherein said another film is made of non-superconducting material.

3. The process set forth in claim 2 wherein said another film has crystal structure and/or lattice constants which are similar to that of oxide superconductor of which the first film is made.

4. The process set forth in claim 2 wherein said another film is made of $BaF_2$.

5. The process set forth in claim 1 wherein said another film has a thickness of several nanometers (nm).

6. The process set forth in claim 1 wherein said another film is prepared by vacuum evaporation.

7. The process set forth in claim 1 wherein each of said laser beam pulses has the energy density of 0.01 to 0.1 $J/cm^2$.

8. The process set forth in claim 1 wherein a number of said laser beam pulses directed onto said first film of oxide superconductor is between 1 pulse and 100 pulses.

9. The process set forth in claim 1 wherein said laser beam pulses are generated by an excimer laser.

10. The process set forth in claim 1 wherein irradiation of said laser beam pulses is adjusted by monitoring an irradiated area of the film of oxide superconductor by a reflective high energy electron diffraction (RHEED) analyzer or a low density energy diffraction (LEED) analyzer.

11. The process set forth in claim 1 wherein said first film of oxide superconductor is a superconducting oxide selected from the group consisting of Y—Ba—Cu—O system, Bi—Sr—Ca—Cu—O system and Tl—Ba—Ca—Cu—O system.

12. The process set forth in claim 1 wherein thickness of the first film of oxide superconductor is between 20 to 3,000 Å.

13. The process set forth in claim 1 wherein said first film of oxide superconductor is prepared by sputtering.

14. The process set forth in claim 1 wherein said substrate is a single crystal substrate of oxide.

15. The process set forth in claim 14 wherein said substrate is a single crystal substrate of oxide selected from the group consisting of MgO, $SrTiO_3$, $LaAlO_3$, $LaGaO_3$ and yttrium stabilized zirconia (YSZ).

* * * * *

UNITED STATES PATENT AND TRADEMARK OFFICE
CERTIFICATE OF CORRECTION

PATENT NO. : 5,234,901
DATED : August 10, 1993
INVENTOR(S) : Mitsuchika Saitoh; Michitomo Iiyama It is certified that error appears in the above-indentified patent and that said Letters Patent is hereby corrected as shown below:

On the Title Page, Item [75], change the order of inventors as follows: Michitomo IIYAMA; Mitsuchika SAITOH Signed and Sealed this Thirty-first Day of May, 1994

Attest:

BRUCE LEHMAN

Attesting Officer

Commissioner of Patents and Trademarks